United States Patent [19]

Roberts et al.

[11] Patent Number: 4,500,944
[45] Date of Patent: Feb. 19, 1985

[54] ENCLOSURE FOR ELECTRONIC COMPONENTS

[75] Inventors: Don M. Roberts; David W. Looper, both of Duncan, Okla.

[73] Assignee: Halliburton Company, Duncan, Okla.

[21] Appl. No.: 501,681

[22] Filed: Jun. 6, 1983

[51] Int. Cl.³ .............................................. H05H 7/20
[52] U.S. Cl. .................... 361/384; 165/122; 174/16 R
[58] Field of Search .............. 361/383, 384, 386, 388; 174/16 R; 165/122, 104.33, 104.34, 39

[56] References Cited

U.S. PATENT DOCUMENTS

| | | | |
|---|---|---|---|
| 3,196,940 | 7/1965 | Saslow et al. | 165/122 |
| 3,253,646 | 5/1966 | Koltuniati et al. | 165/39 |
| 3,407,869 | 10/1968 | Staunton | 174/16 R |
| 3,833,053 | 9/1974 | Benteler et al. | 165/122 |
| 3,926,250 | 12/1975 | Engwall | 165/122 |

Primary Examiner—A. D. Pellinen
Assistant Examiner—Gregory D. Thompson
Attorney, Agent, or Firm—Joseph A. Walkowski; Thomas R. Weaver

[57] ABSTRACT

An enclosure for electronic equipment includes an outer housing having an inner housing mounted therein. The inner housing has a fan and air deflector members mounted therein for maintaining a controlled circulation of air flow within the interior region of the inner housing so that air within the interior region is moved in heat exchange relationship with a heat sink member extending into the inner housing. The heat sink member in the inner housing is connected by thermal diodes with another heat sink member attached to a side wall of the outer housing. Another fan directs an air flow over the heat sink member attached to the side wall of the outer housing. A third fan is mounted within the interior region of the outer housing, but externally of the inner housing, for providing air circulation within the interior region of the outer housing.

16 Claims, 12 Drawing Figures

ENCLOSURE FOR ELECTRONIC COMPONENTS

This invention relates generally to an enclosure for electronic components and more particularly, but not by way of limitation, to a trailer-mountable, drill-site usable apparatus for protectively containing within a temperature-controlled environment electronics which include a microcomputer and an associated control panel.

In the oil and gas industry there is the need for electronic control systems for monitoring and controlling many of the various activities which are conducted at a well site. For example, electronic control systems are used for controlling additive metering systems by which mixtures of substances to be pumped downhole are formed. Such systems have relatively delicate electronic components which must survive the harsh environments found at the well site. For example, extreme temperatures are often encountered in the field at a well site. These temperature extremes can damage the electronic components which themselves generate heat. Therefore, there is the need for a suitable apparatus in which electronic components can be contained and protected from the environment.

The novel and improved present invention meets this need by particularly providing in the preferred embodiment an enclosure for a control panel and its associated electronics of the control system disclosed in a co-pending United States patent application entitled "Apparatus and Method for Mixing a Plurality of Substances" and assigned to the assignee of the present invention.

Broadly, the present invention comprises a housing having an interior volume in which electrical components can be retained. The invention also includes temperature control means for transferring heat to or from the interior volume, and the invention includes air movement means for moving air within the interior volume. To appropriately direct the moving air into heat exchange relationship with the temperature control means, the present invention also includes baffle means.

The present invention still further comprises an outer housing in which the first-mentioned (inner) housing is disposed. Another air movement means is located in the outer housing externally of the inner housing. Still another air movement means is included for moving air external to the outer housing but in heat exchange relationship with the temperature control means associated with the inner housing.

The outer housing includes a pivotally connected lid which is retained in its open position by pneumatic lift means.

From the foregoing it is a general object of the present invention to provide a novel and improved enclosure for electronic components. Other and further objects, features and advantage of the present invention will be readily apparent to those skilled in the art when the following description of the preferred embodiment is read in conjunction with the accompanying drawings.

FIG. 9 is a view taken along line 9—9 shown in FIG. 8.

Figure 1:
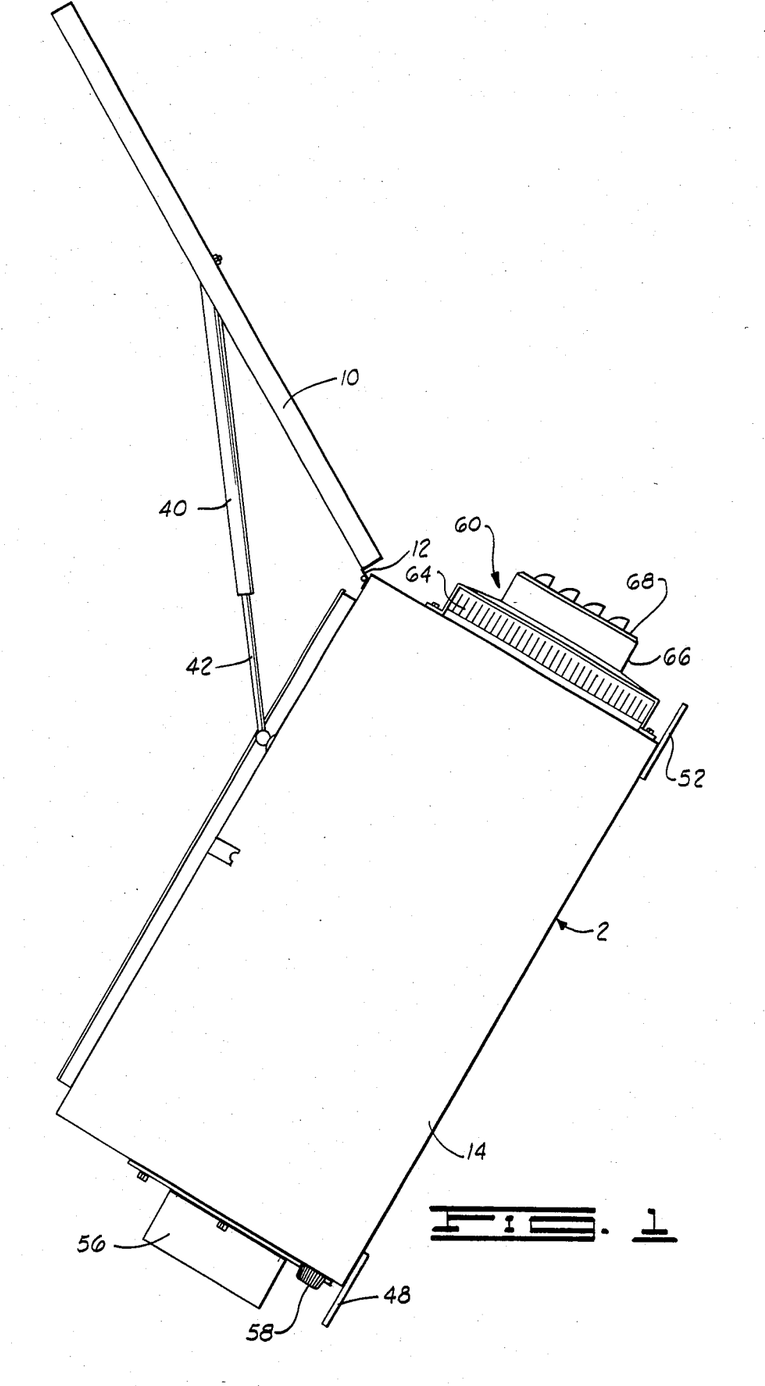
FIG. 1 is a side elevational view of the outer housing of the preferred embodiment of the present invention.
Figure 7:
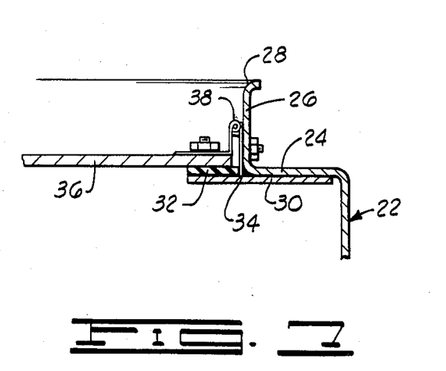
FIG. 7 is a partial sectional view taken along line 7—7 shown in FIG. 2, but with a control panel connected thereto.
Figure 8:
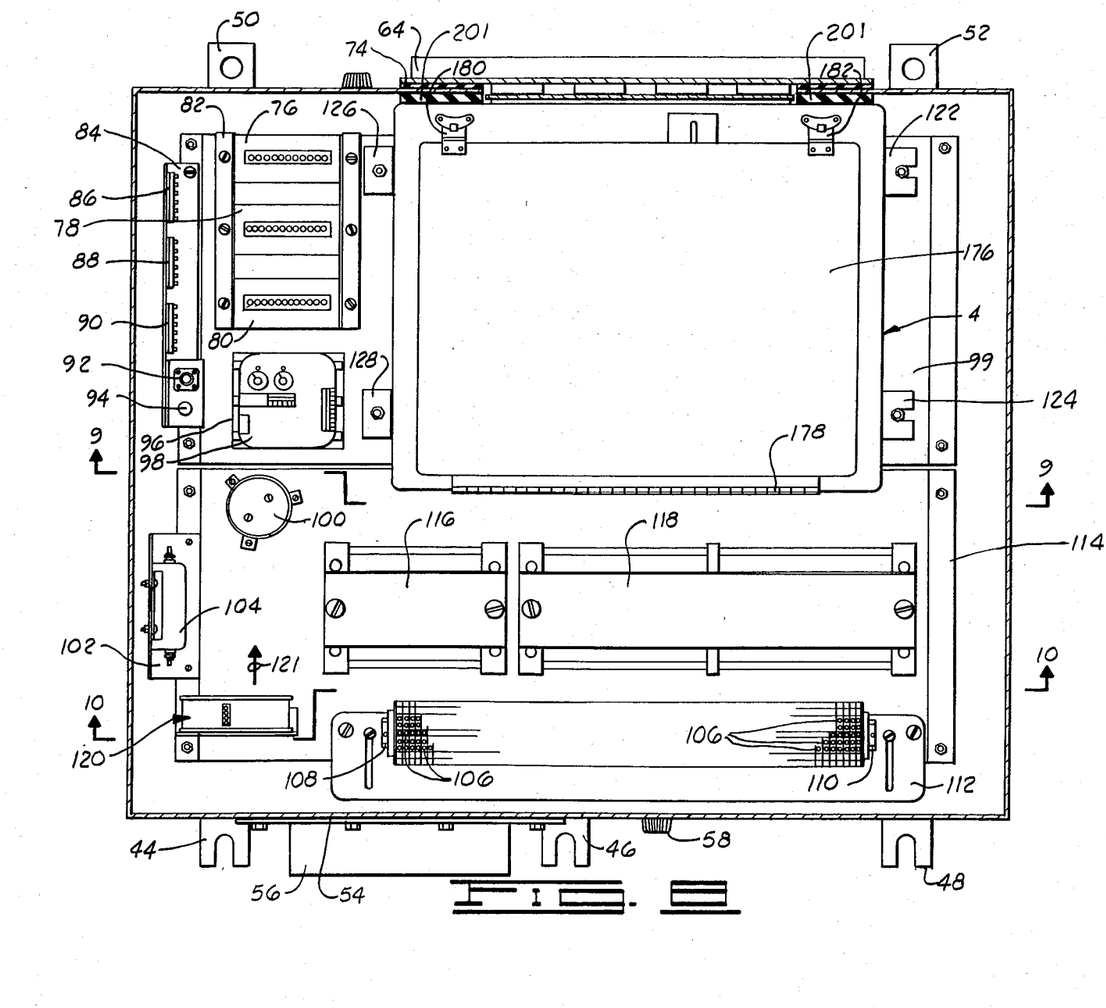
FIG. 8 is a view of the interior of the outer housing, but with the elements of a preferred embodiment included therein and the external cover of thermal assembly removed.

With reference to the drawings, an apparatus constructed in accordance with the preferred embodiment of the present invention will be described. FIGS. 1 and 8 disclose that the apparatus broadly includes an outer housing 2 and an inner housing 4. The structure of the outer housing 2 will be described with reference to FIGS. 1-7, and the contents of a control system contained within the outer housing 2 will be described with reference to FIGS. 8-10. The structure of the inner housing 4 will be described with reference to FIG. 11. The thermal association between the outer housing 2 and inner housing 4 will be described with reference to FIG. 12.

The outer housing 2 of the preferred embodiment is a stainless steel enclosure defined by a bottom wall 6, a side wall 8, and a top wall defined by a lid 10 pivotally connected by a hinge 12 to the side wall 8.

Figure 2:
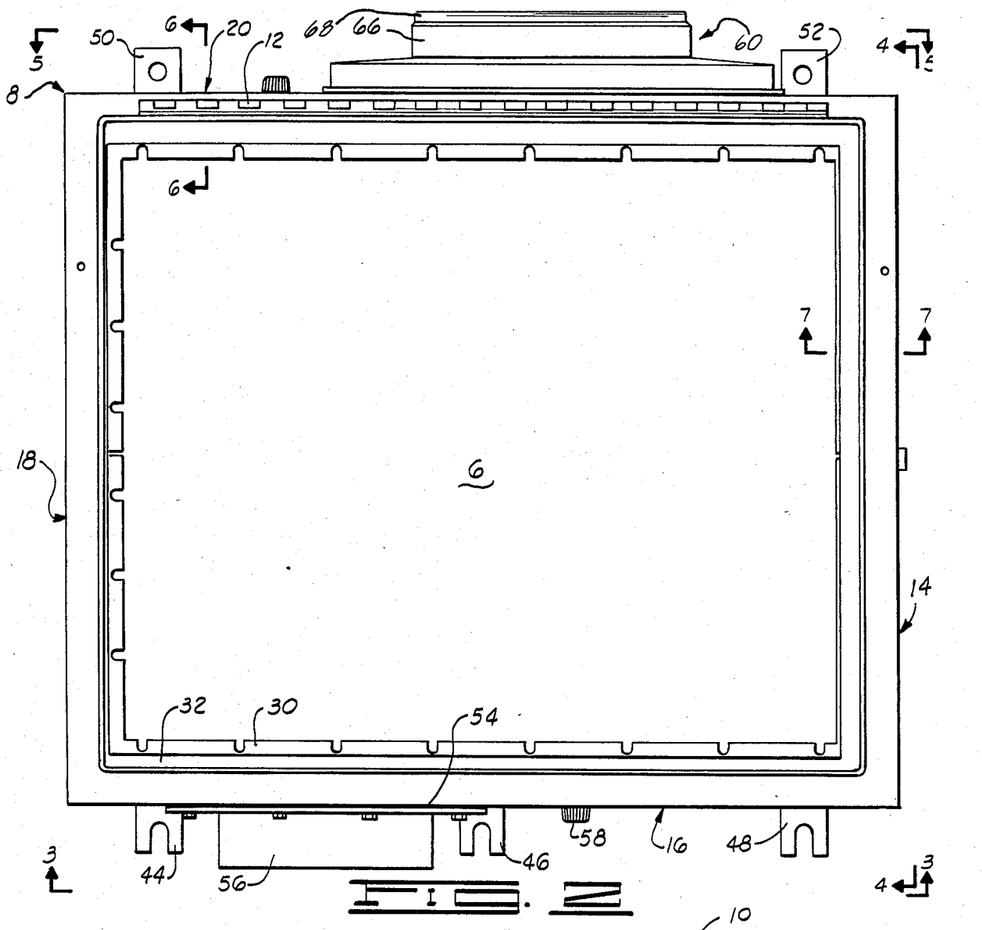
FIG. 2 is a view looking into the outer housing shown in FIG. 1, but with the interior elements and the lid elements removed.

The side wall 8 of the preferred embodiment extends perpendicularly from the bottom wall 6 and is integrally formed therewith. The side wall 8 includes four wall portions 14, 16, 18, and 20. In the preferred embodiment the wall portions 14-20 have substantially equal lengths. By this construction of the side wall 8 with the bottom wall 6, there is defined an interior region or volume bounded by the interior surfaces of the side wall 8 and the bottom wall 6. There is an opening defined in the outer housing 2 at the edge of the side wall 8 opposite the edge thereof integrally associated with the bottom wall 6.

Figure 6:
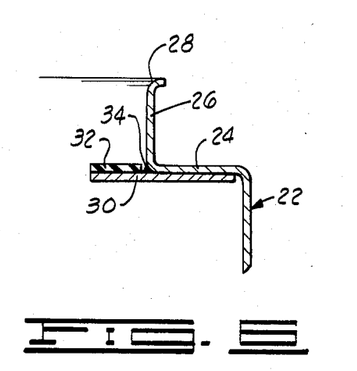
FIG. 6 is a partial sectional view taken along line 6—6 shown in FIG. 2.

The partial cross-sectional view of a part of the side wall 8 which is shown in FIG. 6 discloses that the side wall 8 is constructed of a member 22 having an inwardly extending shoulder portion 24 from which a neck portion 26 perpendicularly extends. At the upper end of the portion 26 there is integrally formed an outwardly curving lip portion 28. Suitably connected to the underside of the shoulder portion 24 is a support plate 30 on which a control panel (subsequently described) can be mounted. A control panel gasket 32 is suitably mounted on the support plate 30. The adjacent faces of the member 22 and the support plate 30 are suitably sealed by a continuous bead 34 of clear Silastic in the preferred embodiment.

A specific embodiment of a control panel contemplated to be used with the present invention disclosed herein is described in a co-pending U.S. patent application Ser. No. 483,001 entitled "Apparatus Method for Mixing a Plurality of Substances" and assigned to the assignee of the present invention and incorporated herein by reference. A portion of this control panel is schematically illustrated in FIG. 7 and identified by the reference numeral 36. FIG. 7 shows that the control panel 36 is connected to the outer housing 2 by a mounting means including a hinge 38 attached by suitable means to the neck portion 26 and to the control panel 36. In the preferred embodiment the control panel 36 is mounted in spaced relationship with the bottom wall 6 so that the electronic components associated with the panel 36 can be mounted in the volume defined by the bottom wall 6, the side wall 8, and the panel 36.

Also hingedly connected to the side wall 8 is the lid 10. The lid 10 is shaped and sized so that it fits over the neck portion 26 of the side wall and so that a sufficient sealing engagement is established between the inner surface of the lid 10 and the lip portion 28 of the side wall 8 when the lid is in its closed position. The lid 10 is shown in its open position in FIG. 1 and in its closed position in FIGS. 3, 4 and 5. In FIGS. 1 and 8, the lid 10 is not shown for purposes of clarity.

To hold the lid 10 in its open position, there is also included a pneumatic lift means including a piston cylinder 40 and a piston rod 42. Although only one piston cylinder 40/piston rod 42 assembly is shown in the drawings, there is an identical one mounted in a similar manner between the lid 10 and the wall portion 18 of the side wall 8. Connections of the cylinder 40 to the lid 10 and of the piston rod 42 to the side wall 8 are made by suitable means known to the art. In the preferred embodiment, the lift means is an Eberhard POWERISE PNEU-SPRING device.

Associated with the outer housing 2 along the bottom wall 6 are brackets 44, 46, 48, 50 and 52. These brackets may be used for connecting the invention to a suitable support structure, such as an additive metering system trailer used at a drill site or well site.

Figure 3:
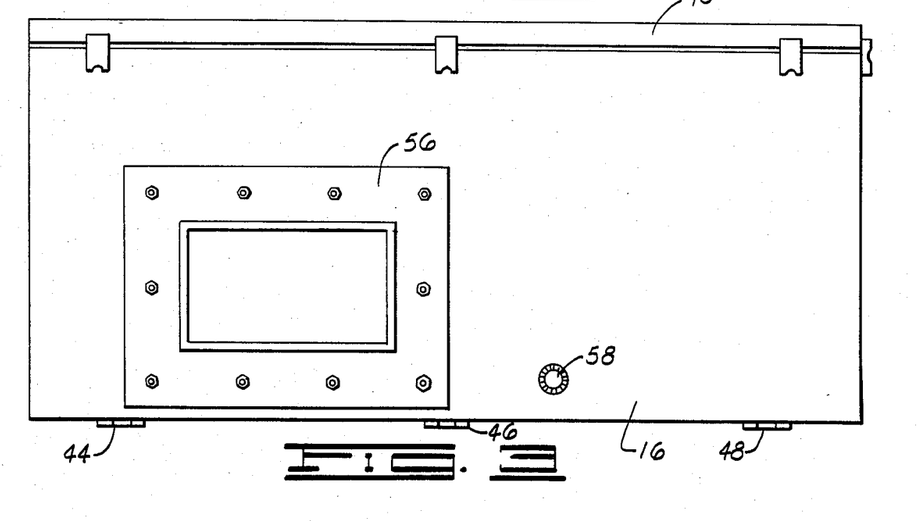
FIG. 3 is a view taken along line 3—3 shown in FIG. 2, but with the lid shown in its closed position.
Figure 4:
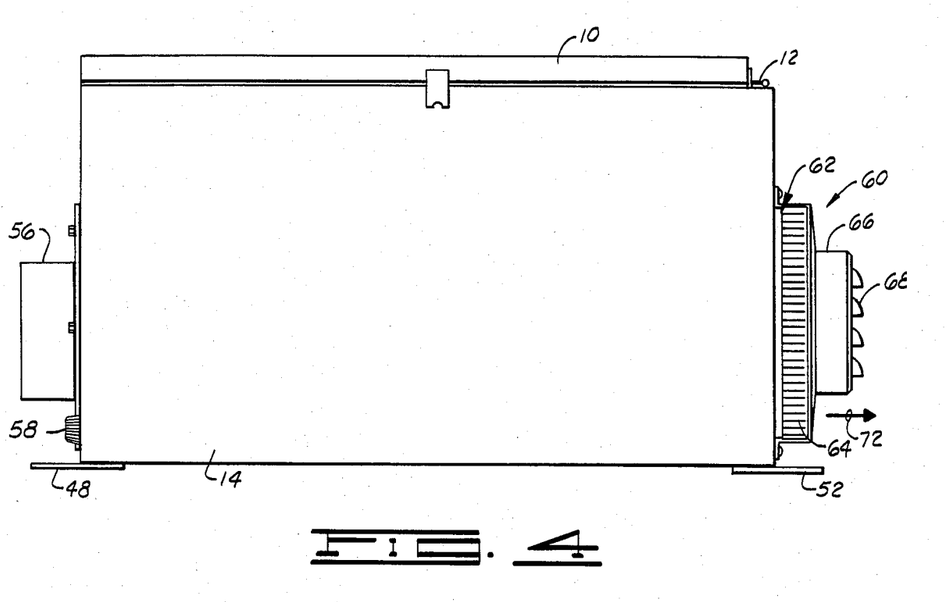
FIG. 4 is a view taken along line 4—4 shown in FIG. 2, but with the lid shown in its closed position.

Associated with an aperture defined through the wall portion 16 of the side wall 8 is a rubber gasket 54 and a transit 56. The gasket 54 and the transit 56 are retained adjacent the wall portion 16 by nuts and bolts as illustrated in FIGS. 2 and 3. By means of the rubber gasket 54 and the transit 56, electrical conductors can be passed into the interior region of the housing 2 and yet a substantial seal between the interior region and the external environment can be maintained. Also associated with the wall portion 16 is a LEXAN cord grip 58.

Associated with the wall portion 20 of the side wall 8 is a temperature control means for controlling the temperature in an interior volume of the inner housing 4. The temperature control means associated with the wall portion 20 includes a thermal assembly 60 having a heat sink member 62 attached to the wall portion 20 so that the member 62 overlies an opening defined in the wall portion 20. The heat sink member 62 has an interior surface facing the interior region of the outer housing 2 and an exterior surface comprising a plurality of fins 64 projecting outwardly from the outer housing on the exterior side of the side wall 8. FIG. 8 discloses a rubber gasket 74 for providing a sealing relationship between the heat sink member 62 and the exterior surface of the wall portion 20 of the side wall 8. The heat sink member 62 is enclosed in the preferred embodiment in an external cover 66 having a louvered covering 68 associated therewith.

On the interior surface of the heat sink member 62 are four thermal diodes 65a, 65b, 65c, 65d (see FIG. 12) of a type known to the art. These thermal diodes extend through the opening defined in the wall portion 20. The thermal diodes are controlled by suitable means (not shown) as known to the art.

On the other side of the thermal diodes opposite the heat sink member 62 is another heat sink member 67 (see FIG. 12) which is smaller than the heat sink member 62. The smaller heat sink member 67 lies within the interior region of the outer housing 2 and inner housing 4. The thermal diodes are sandwiched between the two heat sink members 62 and 67, and secured therebetween by a plurality of screws (not shown) which pass through small heat sink member 67 into holes tapped into heat sink member 62, which screws are tightened to compress the thermal diodes 65a–65d between the two heat sink members.

Figure 5:
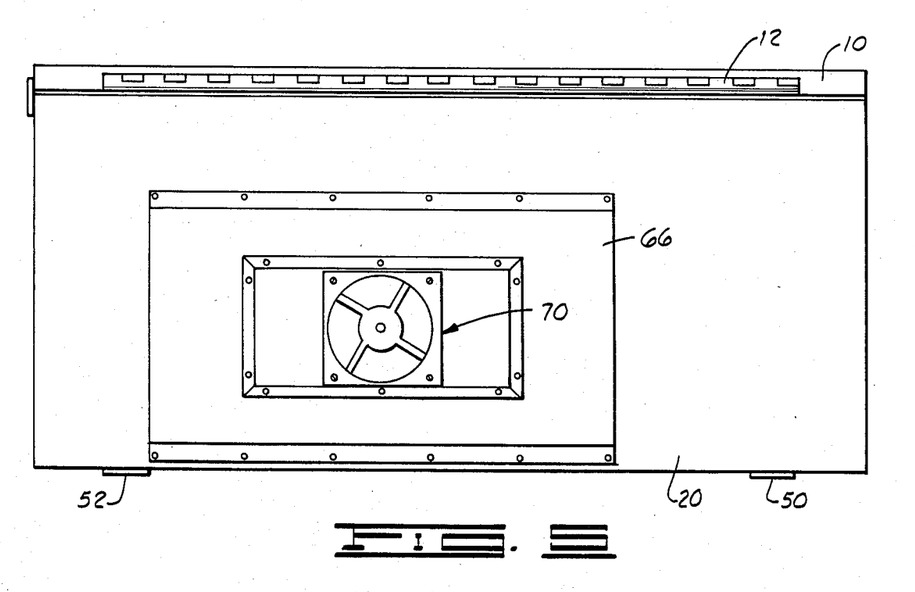
FIG. 5 is a view taken along line 5—5 shown in FIG. 2, but with the louvered covering removed and the lid shown in its closed position.

FIG. 5 shows the thermal assembly 60 without the louvered covering 68. It is apparent from FIG. 5 that the connections of the thermal assembly to the outer housing 2 are made by suitable means such as nuts and bolts. FIG. 5 also discloses that contained within the thermal assembly 60 is a fan 70 which functions as a means for moving air external of the outer housing 2 into heat exchange relationship with the heat sink member 62. In the preferred embodiment, the fan 70 is a Rotron 12-VDC rugged-construction fan. The fan 70 is mounted so that it blows air in a direction out of the page as viewed in FIG. 5 or in a direction defined by the arrow labeled 72 in FIG. 4.

Figure 10:
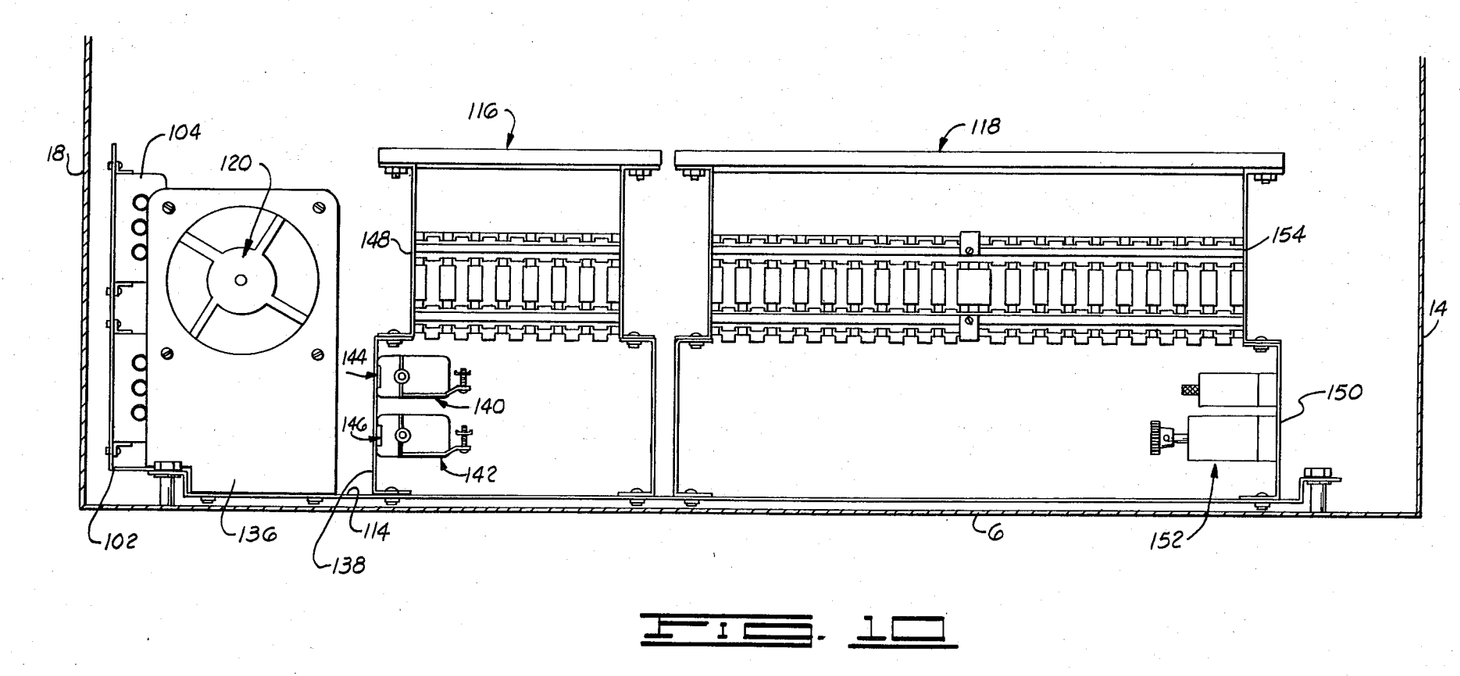
FIG. 10 is a view taken along line 10—10 shown in FIG. 8.

With reference to FIGS. 8–10, specific components which can be mounted in the interior region defined by the bottom wall 6 and the side wall 8 and further defined, or closed, by the control panel 36 and the lid 10 will be described. These components are described for purposes of illustration and do not form a part of the present invention described and claimed herein because the present invention is directed to the outer housing 2, the inner housing 4 and their respective structures and their structural relationship.

FIG. 8 discloses DC-DC converters 76, 78 and 80 retained in the interior region of the outer housing 2 by a suitable power supply mounting bracket 82.

Another bracket 84 is mounted in the interior region and has a plurality of terminal strips (such as terminal strips 86, 88 and 90 shown in FIG. 8) retained thereon by suitable means, such as nuts and bolts. Terminal strips 86, 88 and 90 are denoted in FIG. 8 by way of illustration. The bracket assembly 84 also has a power cable connector terminal 92 and a fuse holder 94 associated therewith.

Disposed in the interior region of the outer housing 2 near the mounting bracket 84 is a DC-AC inverter bracket assembly 96 disposed beneath a continuous pH monitor device 98.

The elements 76–98 are mounted on a bottom plate 99 attached to the bottom wall 6 by suitable means.

A computer grade capacitor 100 is retained in a capacitor terminal protection cap and mounting clamp retained in the interior region of the outer housing 2.

An RFI filter mounting bracket 102 having a plurality of 30-amp power line filters associated therewith (filter 104 is shown) is also mounted in the interior region.

FIG. 8 also discloses that modular terminal blocks 106 are retained within the interior region by means of end clamps 108 and 110 which are connected to a terminal block bracket assembly 112 adjustably retained on a bottom plate 114.

The bottom plate 114 also has the elements 100, 102 and 104 associated therewith. Also mounted on the bottom plate 114 are printed circuit board retainer assemblies 116 and 118.

It is to be noted that the elements 76-98, 100-112, 116 and 118 do not form parts of the present invention. The bottom plates 99 and 114 are parts of the present invention in that they provide the means for suitably mounting components in the interior region of the outer housing 2. Another part of the present invention shown in FIGS. 8 and 10 is an air movement means including a fan 120 which is suitably mounted on the bottom plate 114. The fan 120, when activated, moves air in the interior region of the outer housing 2 to help maintain suitable operating temperatures for the electrical components retained therein.

The fan 120 of the preferred embodiment is a Rotron 12-VDC rugged-construction fan. The fan 120 drives air in the direction indicated in FIG. 8 by the arrow labeled with the reference numeral 121.

Also forming a part of the invention is the inner housing 4 shown in FIG. 8 to be mounted on the bottom plate 99 by mounting brackets 122, 124, 126 and 128.

Before the construction of the preferred embodiment of the inner housing 4 is further described, a brief description of FIGS. 9 and 10 will be given.

FIG. 9 discloses that the bottom plate 99 is mounted within the interior region of the outer housing 2 by a plurality of nuts and stanchions, two of which are shown in FIG. 9 and identified by the reference numerals 130 and 132.

FIG. 9 discloses the DC-AC inverter bracket assembly 96 has a purality of DC-AC inverters 134 mounted thereon. This assembly is disposed beneath the continuous pH monitor device 98.

FIG. 9 also discloses an end view of the inner housing 4 which will be described subsequently.

FIG. 10 discloses that the fan 120 has a fan mounting bracket 136 suitably retained on the bottom plate 114.

The printed circuit board retainer assembly 116 has a seven-position analog card mounting bracket 138 to which two 32-pin male cable connectors 140, 142 and two 32-pin female connectors 144, 146 are connected. Attached to the top of the seven-position analog card mounting bracket 138 is a seven-position printed circuit card stack 148.

The printed circuit card retainer assembly 118 includes an 18-position analog card mounting bracket 150 having a 38-pin solder terminal connector, a 56-pin solder terminal connector and a 90-pin solder terminal (generally identified by the reference numeral 152) associated therewith. Mounted on the top of the analog card mounting bracket 150 is an 18-position printed circuit card stack 154.

Figure 11:
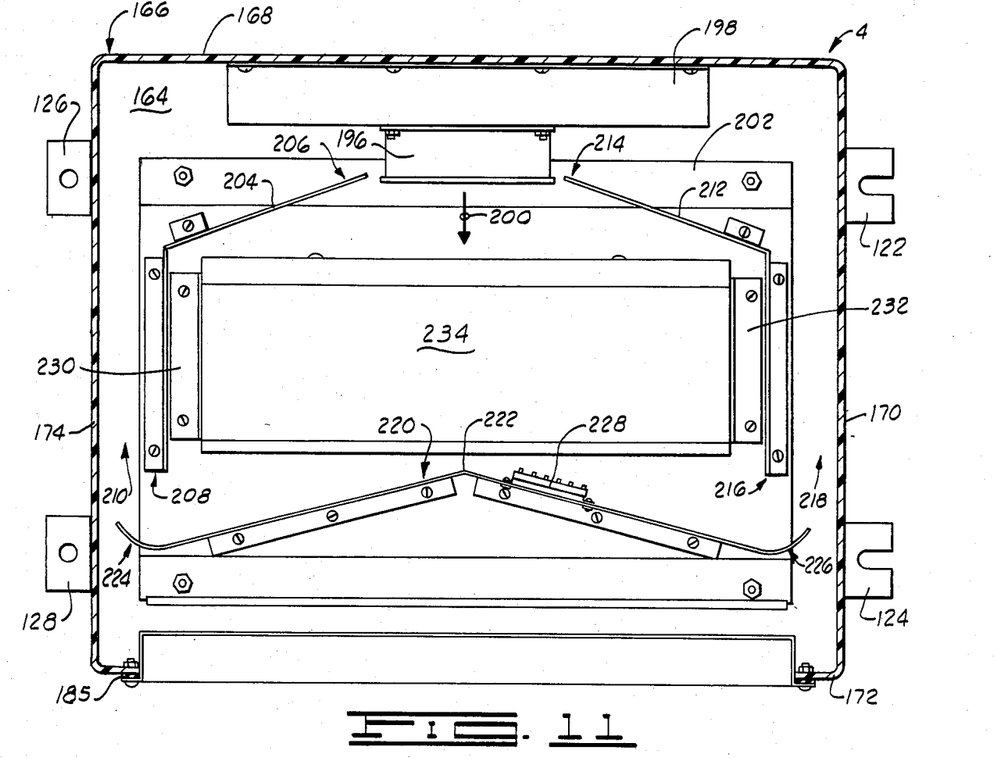
FIG. 11 is an interior view, taken along line 11—11 shown in FIG. 9, of the inner housing of the present invention and its associated elements.

With reference to FIGS. 8, 9 and 11, the preferred embodiment of the inner housing 4 will be described. As noted previously, the inner housing 4 is mounted on the bottom plate 99 by means of the brackets 122, 124, 126 and 128 and by screws or bolts or other suitable fastening means as illustrated in FIG. 9. The brackets 122-128 are suitably secured to a bottom wall 164 defining a portion of the inner housing 4.

Extending perpendicularly from and integrally formed with the bottom wall 164 is a side wall 166 having a wall portion 168, a wall portion 170, a wall portion 172, and a wall portion 174 associated and sized so that the side wall 166 has a substantially square perimeter. The bottom wall 164 and the side wall 166 define an interior region or volume within the inner housing 4.

As shown in FIGS. 8 and 9, the inner housing 4 also includes a top wall defined by a lid 176 hingedly connected to the wall portion 172 of the side wall 166 by a hinge 178. The lid 176 has latches 180 and 182 associated therewith for securing the lid 176 in a closed position adjacent an inwardly directed shoulder of the side wall 166 as illustrated in FIG. 8. The lid 176 provides a closeable entry to the interior volume of the inner housing 4.

In the preferred embodiment the walls of the housing 4 are made of fiber glass.

Disposed within the interior region of the inner housing 4 are various additional elements of the present invention. As shown in FIGS. 9 and 11, the wall portion 172 has an opening in which an electrical connector mounting plate 184 is mounted. The plate 184 includes a plurality of 25-pin connectors, one of which is identified in FIG. 9 by the reference numeral 186, and a plurality of 50-pin ribbon cable connectors, one of which is identified by the reference numeral 188. The plate 184 also includes a 36-pin ribbon cable connector 190. Two box mounting receptacles 192 and 194 are also contained on the plate 184. It is through these connectors of the plate 184 that electrical connections are made between electronic components mounted within the interior volume of the inner housing 4 and electronic elements external to the inner housing 4. A elastomeric gasket 185 is disposed between the connector mounting plate 184 and the exterior surface of the wall portion 172 of the side wall 166 to provide a sealed junction between the mounting plate 184 and the side wall 166.

With reference to FIG. 11, the portions of the present invention contained within the interior volume of the inner housing 4 will be described. The interior components include air movement means for moving air within the interior volume, which air is heated, at least in part, by electronic components which are mountable within the interior region of the preferred embodiment as will be subsequently described. In the preferred embodiment shown in FIG. 11, the air movement means includes a fan 196, such as a 12-VDC Rotron fan having a rugged construction, which is mounted on the interior surface of the wall portion 168 of the side wall 166 by a fan mounting bracket 198. The fan 196 drives air in the direction indicated by the arrow labeled with the reference numeral 200.

Figure 12:
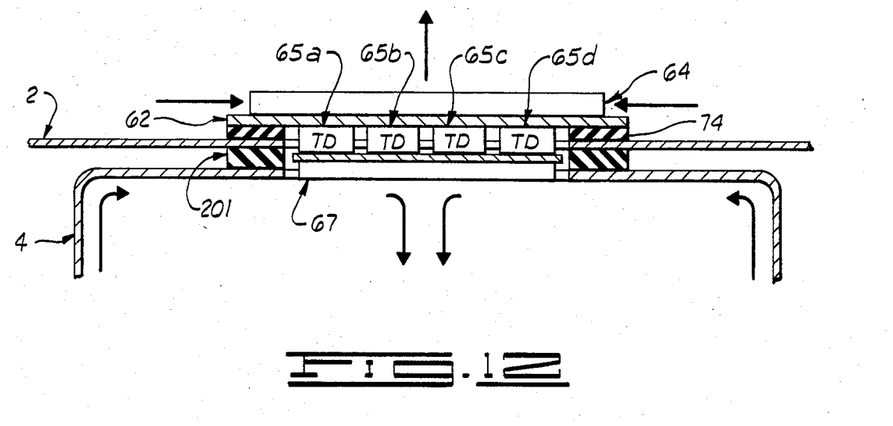
FIG. 12 is a schematic illustration of the association among the outer housing, the inner housing and the temperature control means.

Defined in the section of the wall portion 168 to which the fan mounting bracket 198 is attached is an opening through which the smaller heat sink 67 of the temperature control means extends when the inner housing 4 is mounted in the outer housing 2 as illustrated in FIG. 12. This opening is sized so that no direct contact between the smaller heat sink member 67 and the wall portion 168 occurs when the inner housing 4 is properly positioned within the outer housing 2. Adhesively attached around the perimeter of the opening defined in the wall portion 168 is a rubber sponge gasket 201 (see FIGS. 8 and 12) that provides a seal between the inner housing 4 and the outer housing 2 when the two are properly associated.

Mounted within the interior volume of the inner housing 4 and extending from the discharge end of the fan 196 is a bottom plate 202 mounted in spaced relationship with the bottom wall 164 by nuts and stanchions as known to the art. This type of mounting is illustrated, for example, in FIG. 9 with reference to the bottom wall 99 mounted in the outer housing 2.

Mounted on the bottom plate 202 is a baffle means for directing the air moved by the fan 196 into heat exchange relationship with the smaller heat sink member 67 of the temperature control means. The baffle means includes first baffle means for directing the air to flow in a first direction. The first baffle means as shown in the preferred embodiment illustrated in FIG. 11 includes a first angle member 204 having an end 206 disposed in the interior volume closer to the fan 196 than is another end 208 of the angle member 204. The angle member 204 is connected to the bottom plate 202 by screws or other suitable means so that a first channel 210 is defined between the angle member 204 and the side wall 166, particularly the wall portions 174 and 168. The inlet of the channel 210 is defined in the vicinity of the end 208 of the angle member 204 and the outlet of the channel 210 is defined in the vicinity of the end 206 of the angle member 204. The first baffle means also includes a second angle member 212 having an end 214 disposed closer to the fan 196 than is an end 216 of the angle member 212. The angle member 212 defines a second channel 218 having an inlet adjacent the end 216 and having an outlet adjacent the end 214. The channel is defined in the preferred embodiment between the angle member 212 and the wall portions 170 and 168 of the side wall 166.

The baffle means includes second baffle means for directing the air which has flowed in the first direction to flow in a second direction from which the air comes into heat exchange relationship with the heat sink member 67. The second baffle means includes a deflector member 220 extending through the interior volume of the inner housing 4 in overlapping association with the ends 208 and 216 so that the air is directed into the inlets of the channels 210 and 218. By so directing the air into the inlets of the channels 210 and 218, the air is thereafter forced to flow through the channels and out the outlets thereof into heat exchange relationship with the heat sink member 67. In the preferred embodiment shown in FIG. 11, the deflector member 220 includes a third angle member having a vertex 222 substantially colinear with an axis of rotation of the fan 196. The angle member has a first curved end 224 associated with the end 208 of the angle member 204 and another curved end 226 associated with the end 216 of the angle member 212. Mounted on one leg of the angle member is a terminal strip 228.

Also mounted on the bottom plate 202 are mounting brackets 230, 232 used for mounting an STD bus card rack capable of holding twenty-two printed circuit cards of an STD bus and associated microcomputer. This rack is identified by the reference numeral 234 as shown in FIG. 11. The elements 230, 232 and 234 provide means for mounting a microcomputer within the interior volume between the first and second angle members 204, 212 and between the fan 196 and the deflector member 220.

The preferred embodiment angle members 204, 212 and 220 have heights which are almost equal to the height of the card rack 234. The angle member 220, in particular, is a little shorter so that one or more ribbon cables, or the like, (not shown) can be connected between the connectors of the connector mounting plate 184 and cards in the card rack 234.

In operation or use, the present invention provides a sealed container for protectively housing electronic components, particularly of a control system in the preferred embodiment. The present invention also provides a container in which the temperature can be controlled.

The temperature within the outer housing 2 is controlled, at least to some degree, by means of the fan 120 which circulates the air within the interior region of the outer housing 2.

The temperature within the inner housing 4 is controlled by means of the temperature control means and the fans 70 and 196. The temperature control means is operable in either a cooling mode or a heating mode. In the cooling mode, current is directed through the thermal diodes 65a, 65b, 65c, and 65d in a first direction as known to the art. This current causes the ends of the diodes adjacent the smaller heat sink member 67 to be relatively cool. This, in turn, causes the smaller heat sink member 67 to be relatively cool. In the heating mode, the current is directed through the thermal diodes in the opposite direction so that the smaller heat sink member 67 ultimately becomes relatively warmer as known to the art. Thermostatic control of the heating and cooling modes can be affected as known to the art.

In either mode of the temperature control means, the fans 70 and 196 are activated to cause air to pass in heat exchange relationship with the respective heat sink member. The flows of air created by these fans are generally indicated by the arrows shown in FIG. 12.

By constructing the inner housing 4 in the above-described fashion, and as illustrated in the drawings, and by mounting the inner housing 4 within the outer housing 2 in heat exchange relationship with the temperature control means of the outer housing 2, there is provided a novel and improved enclosure for electronic components by means of which the temperature can be maintained to insure that the electronic components do not become overheated or do not become overcooled. This temperature control is effected through the operation of the fans and the temperature control means in the enclosed housings described hereinabove.

Thus, the present invention is well adapted to carry out the objects and attain the ends and advantages mentioned above as well as those inherent therein. While a preferred embodiment of the invention has been described for the purposes of this disclosure, numerous changes in the construction and arrangement of parts can be made by those skilled in the art, which changes are encompassed within the spirit of this invention as defined by the appended claims.

What is claimed is:

1. An enclosure for providing a temperature-controlled environment, comprising:
   a housing, including:
   a first wall;
   a second wall connected to said first wall, said first and second walls defining an interior volume therebetween; and
   a third wall connected to said second wall in movable relationship thereto and providing a closable entry to said interior volume;
   temperature control means for transferring heat to or from said interior volume and including a heat transfer means disposed in said second wall, said heat transfer means having a surface area disposed in said interior volume;

air movement means for moving air within said interior volume, said air movement means including a fan associated with said surface area of said heat transfer means;

first baffle means for directing said air moved by said air movement means to flow in a first direction within said interior volume; said first baffle means including:

a first angle member, having a first end and a second end disposed in said interior volume so that said first end is closer to said fan than is said second end, and so that a first channel is defined between said first angle member and said second wall, said first channel having an inlet associated with said second end and having an outlet associated with said heat transfer means; and a second angle member having a third end and a fourth end, disposed in said interior volume so that said third end is closer to said fan than is said fourth end, and so that a second channel is defined between said second angle member and said second wall, said second channel having an inlet associated with said fourth end and having an outlet associated with said heat transfer means; and second baffle means for directing said air which has flowed in said first direction to flow in a second direction from which said air comes into heat exchange relationship with said temperature control means, said second baffle means including:

a deflector member extending at least partially across said interior volume in overlapping association with said second and fourth ends so that said air moved by said air movement means is directed into the inlets of said first and second channels.

2. An enclosure as defined in claim 1, wherein:
said heat transfer means further includes:
a first heat sink member attached to said second wall overlying an opening therethrough;
a second heat sink member associated with said first heat sink member, said second heat sink member extending into said housing through said opening defined in said second wall; and
thermal diode means disposed between said first and second heat sink members for relatively cooling said first heat sink member and relatively heating said second heat sink member when said thermal diode means is operating in a first mode and for relatively heating said first heat sink member and relatively cooling said second heat sink member when said thermal diode means is operating in a second mode;
a first channel is defined between said first angle member and said housing, said first channel having an inlet associated with said second end and having an outlet associated with said second heat sink member;
a second angle member, having a third end and a fourth end, disposed in said second interior region so that said third end is closer to said fan than is said fourth end, and so that a second channel is defined between said second angle member and said housing, said second channel having an inlet associated with said fourth end and having an outlet associated with said second heat sink member; and
a deflector member extending through said second interior region in overlapping association with said second and fourth ends so that said air is directed into the inlets of said first and second channels.

3. An apparatus as defined in claim 2, further comprising:
second air movement means for moving air external to said first housing into heat exchange relationship with said temperature control means; and
third air movement means for moving air outside of said second housing, but within said first interior region.

4. An apparatus as defined in claim 3, wherein said first housing further includes:
a lid pivotally connected to said side wall for pivotation between an open position and a closed position; and
pneumatic lift means for retaining said lid in said open position.

5. An enclosure as defined in claim 2, wherein said deflector member includes a third angle member having a vertex substantially colinear with an axis of rotation of said fan, said third angle member also having a first curved end and a second curved end, said first and second curved ends being associated with said second and fourth ends, respectively.

6. An apparatus as defined in claim 5, further comprising:
second air movement means for moving air external to said first housing into heat exchange relationship with said first heat sink member; and
third air movement means for moving air outside of said second housing, but within said first interior region.

7. An apparatus as defined in claim 5, wherein:
a apparatus further comprises means for mounting said microcomputer within said second interior region between said first and second angle members and between said fan and said third angle member.

8. An apparatus as defined in claim 7, further comprising:
second air movement means for moving air external to said first housing into heat exchange relationship with said first heat sink member; and
third air movement means for moving air outside of said second housing, but within said first interior region.

9. An apparatus as defined in claim 8, wherein said first housing further includes:
a lid pivotally connected to said side wall for pivotation between an open position and a closed position; and
pneumatic lift means for retaining said lid in said open position.

10. An enclosure as defined in claim 1, further comprising another air movement means for moving air external to said interior volume into heat exchange relationship with said temperature control means.

11. An enclosure as defined in claim 1, wherein said deflector member includes a third angle member having a vertex substantially colinear with an axis of rotation of said fan, said third angle member also having a first curved end and a second curved end, said first and second curved ends being associated with said second and fourth ends, respectively.

12. An enclosure as defined in claim 11, further comprising an additional fan, said additional fan being associated with said heat sink member externally of said housing.

13. An enclosure as defined in claim 1, further comprising means for mounting a microcomputer within said interior volume between said first and second angle members and between said fan and said deflector member.

14. An enclosure as defined in claim 13, wherein said deflector member includes a third angle member having a vertex substantially colinear with an axis of rotation of said fan, said third angle member also having a first curved end and a second curved end, said first and second curved ends being associated with said second and fourth ends, respectively.

15. An enclosure as defined in claim 14, further comprising an additional fan, said additional fan being associated with said heat sink member externally of said housing.

16. An apparatus which contains a control panel and electronic components associated with said control panel, said apparatus comprising:
 a first housing, including:
 a bottom wall;
 a side wall extending from said bottom wall and defining a first interior region therewith, said side wall having an opening defined therethrough; and
 mounting means for connecting, in spaced relationship with said bottom wall, said control panel to said side wall;
 a second housing, disposed in said first interior region between said control panel and said bottom wall, for receiving at least a portion of said electronic components, said second housing having a second interior region defined therein and an opening therethrough;
 temperature control means for transferring heat to or from said second interior region through said opening in said side wall of said first housing, said temperature control means including:
 a first heat sink member attached to said side wall overlying said sidewall opening;
 a second heat sink member associated with said first heat sink member, said second heat sink member extending into said second housing through said second housing opening; and
 thermal diode means disposed between said heat sink members for relatively cooling said first heat sink member and relatively heating said second heat sink member when said thermal diode means is operating in a first mode and for relatively heating said first heat sink member and relatively cooling said second heat sink member when said thermal diode means is operating in a second mode;
 first air movement means for moving air within said second interior region including a fan associated with said second heat sink member; and
 baffle means for directing said air moved by said first air movement means into heat exchange relationship with said temperature control means, said baffle means including:
 a first angle member, having a first end and a second end, disposed in said second interior region so that said first end is closer to said fan than is said second end, and so that a first channel is defined between said first angle member and said second housing, said first channel having an inlet associated with said second end and having an outlet associated with said second heat sink member;
 a second angle member, having a third end and a fourth end, disposed in said second interior region so that said third end is closer to said fan than is said fourth end, and so that a second channel is defined between said second angle member and said second housing, said second channel having an inlet associated with said fourth end and having an outlet associated with said second heat sink member; and
 a deflector member extending at least partially across said second interior region in overflapping association with said second and fourth ends so that said air is directed into the inlets of said first and second channels.

* * * * *